(12) United States Patent
Boemler et al.

(10) Patent No.: US 6,911,639 B2
(45) Date of Patent: Jun. 28, 2005

(54) CMOS SYSTEM FOR CAPTURING AN IMAGE AND A METHOD THEREOF

(75) Inventors: Christian Boemler, Cortland, NY (US); Jeffrey Zarnowski, McGraw, NY (US)

(73) Assignee: Silicon Video, Inc., Ithaca, NY (US)

( * ) Notice: Subject to any disclaimer, the term of this patent is extended or adjusted under 35 U.S.C. 154(b) by 131 days.

(21) Appl. No.: 10/141,008

(22) Filed: May 7, 2002

(65) Prior Publication Data

US 2002/0175270 A1 Nov. 28, 2002

Related U.S. Application Data (60) Provisional application No. 60/289,076, filed on May 7, 2001.

(51) Int. Cl.[7] .......................... H01J 40/14; H01L 27/00
(52) U.S. Cl. .................. 250/208.1; 348/275; 348/296; 348/297
(58) Field of Search ..................... 250/208.1, 214 A, 250/226; 348/273, 275, 296, 297, 300, 303, 304, 307; 358/482, 513, 514

(56) References Cited

U.S. PATENT DOCUMENTS

| | | | |
|---|---|---|---|
| 5,665,959 A | * | 9/1997 | Fossum et al. ............. 250/208.1 |
| 6,084,229 A | | 7/2000 | Pace et al. |
| 6,152,619 A | | 11/2000 | Silverbrook |
| 6,166,831 A | | 12/2000 | Boyd et al. |
| 6,194,770 B1 | | 2/2001 | Zarnowski et al. |
| 6,232,589 B1 | | 5/2001 | Pace et al. |
| 6,248,991 B1 | | 6/2001 | Chen et al. |
| 6,570,615 B1 | * | 5/2003 | Decker et al. .............. 348/272 |

* cited by examiner

Primary Examiner—Kevin Pyo
(74) Attorney, Agent, or Firm—Bernhard P. Molldrem, Jr.

(57) ABSTRACT

A system for capturing an image includes a CMOS imaging system, an image focusing device, and an image control processing system coupled to the CMOS imaging system. The CMOS imaging system has at least one CMOS imager with at least one series of pixels. The image focusing device directs the image on to at least a portion of the at least one series of pixels. The CMOS imager may have two or more series of pixels at least adjacent each other where each of the series of pixels is offset from another one of the series of the pixels by a reciprocal of the total number of series of pixels in the CMOS imager.

10 Claims, 4 Drawing Sheets

CMOS SYSTEM FOR CAPTURING AN IMAGE AND A METHOD THEREOF

The present invention claims the benefit of U.S. Provisional Patent Application Ser. No. 60/289,076, filed May 7, 2001, which is hereby incorporated by reference in its entirety.

FIELD OF THE INVENTION

The present invention relates generally to image capture systems and, more particularly, to a system for capturing an image that utilizes low power CMOS imager technology and offset series of pixels.

BACKGROUND OF THE INVENTION

Scanning systems are used for a variety of image capture applications, such as web inspection and copying documents. To date, these scanning systems have utilized either Contact Image Sensor (CIS) modules or CCDs to capture the image information. In these scanning systems, CCD imagers are only a fraction of the width of the object being scanned, such as a document, because of charge transfer difficulties over large distances.

Figure 1:
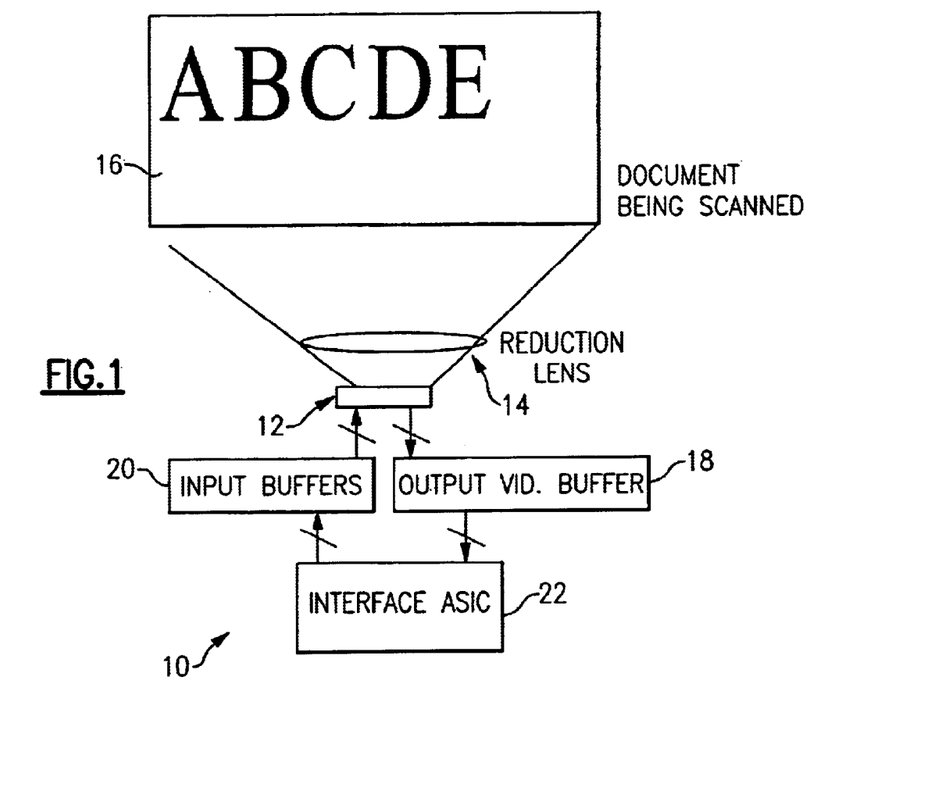
FIG. 1 is a block diagram of a prior art CCD scanning system.
Figure 2:
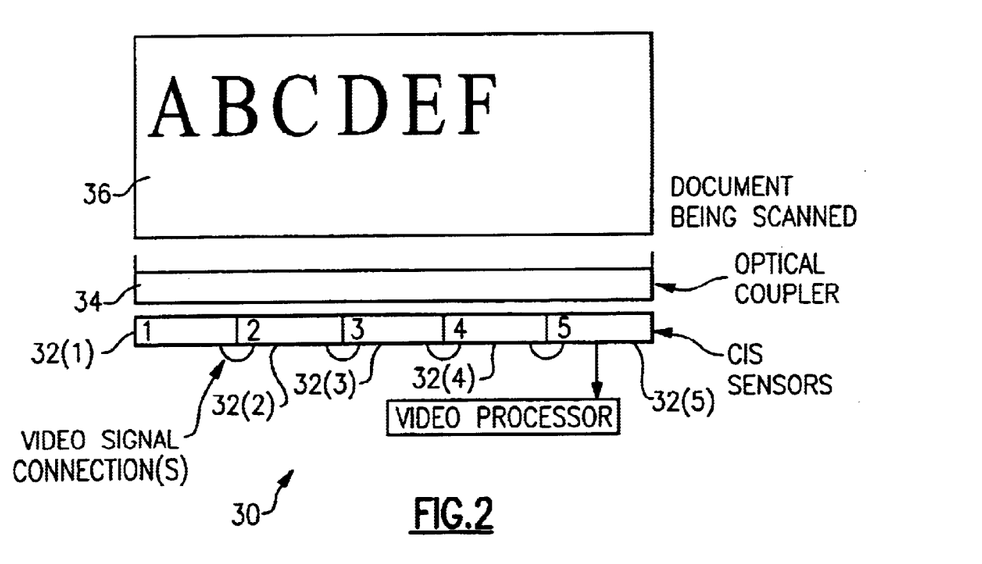
FIG. 2 is a block diagram of a prior art CIS scanning system.

Referring to FIG. 1, a scanning system 10 with a CCD imager 12 is illustrated. A lens system 14 with or without a mirror or a mirror is positioned to focus a reduced image of the object 16 being scanned onto the CCD imager 12. An output buffer 18 is coupled to the CCD imager 12 and is used to drive the flexible cable to drive application specific integrated circuit (ASIC) 22. An input buffer 20 is also coupled to the CCD imager 12 and is used to condition signals and drive the CCD 12. The ASIC 22 is coupled to the input and output buffers and is used to interface the captured image data, digitized by Analog to Digital converter (A/D), to the host computer, networks or other peripheral devices such as printers or modems or as part of or a complete Multi-Function Peripheral (MFP) with image processing functions, motor control, light control, sheet feeder, and user interface ASIC. A desk top scanning system also contains a motor and a light source to move the imager underneath the image to be scanned. Different light sources, like florescent and Light Emitting Diode (LEDs) and different motors like stepping and synchronous motors can be used, are not shown here and are known to those in the art. Unfortunately, CCD imagers have many limitations including speed limitations due to charge transfer efficiency, large power consumption, and very limited capability to integrate other functions onto the pixel array. Additionally, in CCD imagers the pixels must be read out in a fixed sequence which does not allow for pixel information to be skipped Referring to FIG. 2, a scanning system 30 with CIS modules 32(1)–32(5) is illustrated. The CIS modules 32(1)–32(5) are located in tight proximity to each other to construct a long contiguous array of sensors as wide as the image being captured. An optical coupler 34 is positioned to focus an image of the object 36 being scanned onto the CIS modules 32(1)–32(5). Unfortunately, since these scanning systems are as wide as the object being scanned, they are often quite large. Additionally, accurately placing together the CIS modules 32(1)–32(5) to form a complete width of the image to be scanned is an expensive process. The multiple sensors have offsets that must be corrected adding to the complexity of the system to correct offsets.

SUMMARY OF THE INVENTION

A system for capturing an image in accordance with one embodiment of the present invention includes a CMOS imaging system, an image focusing device, and an image control processing system coupled to the CMOS imaging system. The CMOS imaging system has at least one CMOS imager with at least one series of pixels. The image focusing device directs the image on to at least a portion of the at least one series of pixels.

A method for scanning an image in accordance with another embodiment of the present invention includes directing the image on to at least a portion of at least one series of pixels in a CMOS imaging system. Next, the directed image is captured with the at least one series of pixels in a CMOS imager in the CMOS imaging system. The CMOS imaging system is controlled during the capturing and processing of the image.

A system for capturing an image in accordance with another embodiment of the present invention includes a first series of pixels in at least one CMOS imager and at least one more series of pixels that are at least adjacent to the first series of pixels in the at least one CMOS imager. The at least one more series of pixels is offset from the first series of pixels.

A method for capturing an image in accordance with another embodiment of the present invention includes offsetting a first series of pixels in at least one CMOS imager from at least one more series of pixels that are at least adjacent to the first series of pixels in the at least one CMOS imager and capturing the image with at least a portion of the offset first series of pixels and the at least one more series of pixels, to enhance the resolution of the captured image.

The present invention provides a system for capturing an image with greater flexibility and lower cost than prior system for capturing images which used CCD imagers or CIS imagers. The present invention includes a full frame shutter to allow all pixels in a series, such as a row or column, to share the same exposure period, independent integration periods for each color to enhance color balance, pixel skipping for multi-resolution imaging, staggered pixels to provide higher resolution in a smaller area, and binning of signals from pixels in different series. The recent advances of useful computing power of hand held and battery operated devices allow the addition of highly integrated, low power, small size scanning systems for the acquisition of images that can be pictures, text, barcodes, biometrics and as a result, puts multi-chip power hungry CCD based systems at a great disadvantage. The only difference between a hand held scanning system and a desktop one is the movement is usually provided by the user and not motors and hence the system diagram of FIG. 3 remains the same.

DETAILED DESCRIPTION

Figures 3, 7:
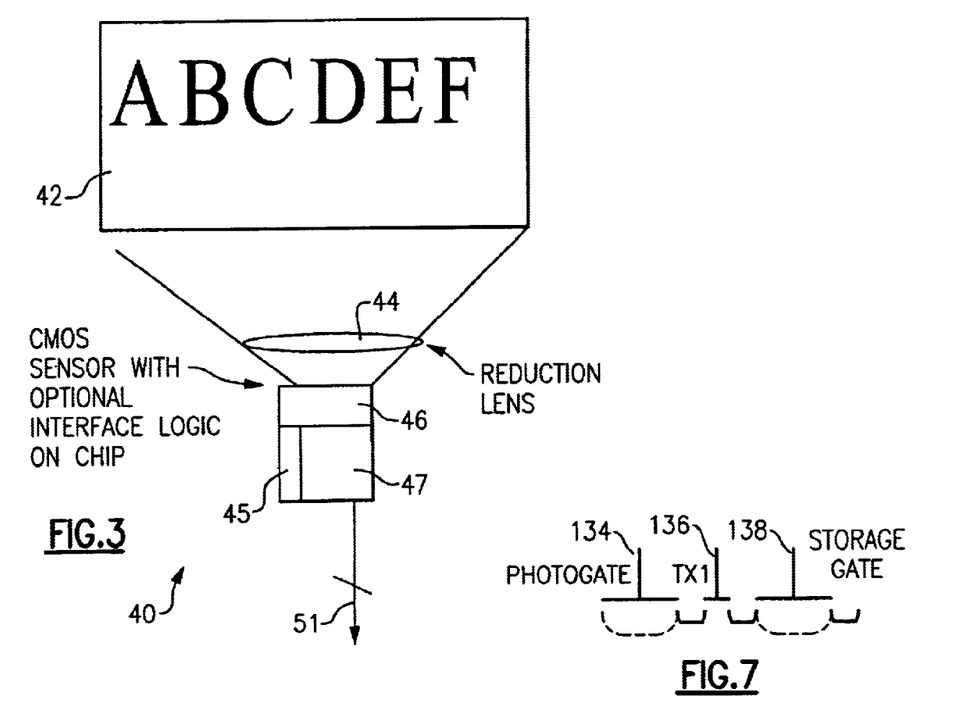
FIG. 3 is a block diagram of a CMOS system for capturing an image in accordance with one embodiment of the present invention.
FIG. 7 is a diagram of an alternate pixel structure for us in the CMOS imaging system shown in FIG. 4 in another embodiment of the present invention.

A system 40 for capturing an image in accordance with one embodiment of the present invention is illustrated in FIG. 3. The system 40 for capturing an image 42 includes a lens 44, a CMOS imaging system 46, an image control processing system 47, and an output bus 51 although the system 40 could comprise other components and arrangements. The image control processing system 47 may be included on the CMOS sensor 46, to eliminate a separate component and reduce system costs. The present invention provides a system for capturing an image with greater flexibility and lower cost than prior systems using CCD imagers or CIS imagers. Additionally, the present invention provides a unique offset pixel structure for use in a CMOS imaging system 46.

Referring to FIG. 3, the lens 44 is positioned in the system to focus or direct the image being scanned or otherwise captured onto the CMOS imaging system 46. In this particular embodiment, the lens 44 reduces the image being scanned on to the CMOS imaging system 46, although the lens 44 could be used to focus or direct the image in other manners, such as a direct transfer without any reduction or to enlarge the image. Additionally, although in this particular embodiment a lens 44 is shown, other types of devices to focus or direct the image being scanned onto the CMOS imaging system 46, such as a mirror or a mirror and lens combination.

Figure 4:
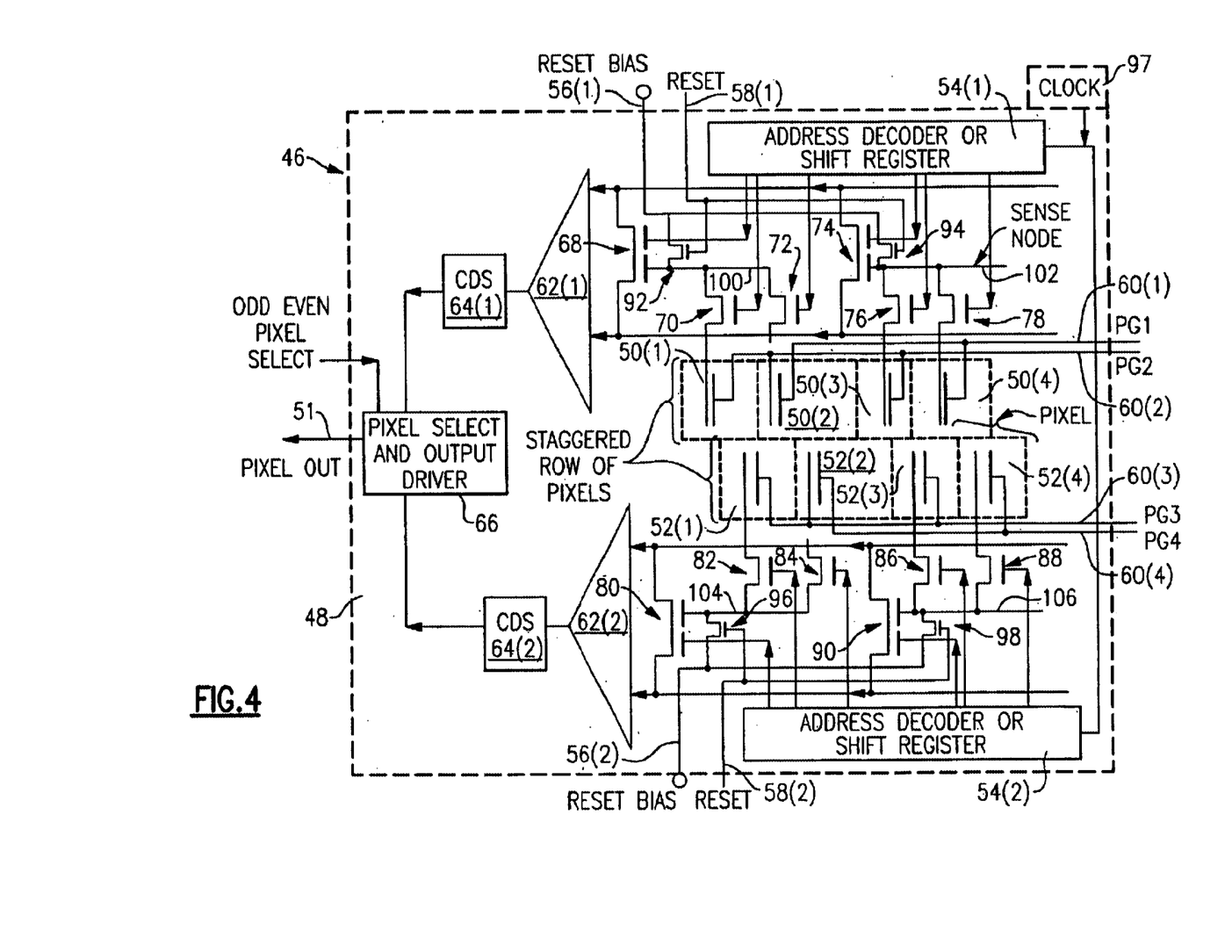
FIG. 4 is a partial block and partial circuit diagram of a CMOS imaging system in accordance with one embodiment of the present invention.

Referring to FIG. 4, the CMOS imaging system 46 on a CMOS chip includes a CMOS imager 48 with a pair of staggered series of pixels 50(1)–50(4) and 52(1)–52(4), such as rows or columns of pixels, pair of address decoders 54(1) and 54(2), a pair of reset biases 56(1) and 56(2), a pair of reset selects 58(1) and 58(2), a pair of photogate selects 60(1) and 60(2), a pair of operational amplifiers 62(1) and 62(2), a pair of correlated double samplers (CDS) 64(1) and 64(2), a pixel select and output driver 66, and a plurality of field effect transistors, although CMOS imaging system 46 may comprise other components and arrangements. In this particular embodiment, pixel refers to the photosensitive element and the pixel control circuitry, although other arrangements are possible, such as the pixel referring to just the photosensitive element.

In this particular embodiment, first and second series of pixels 50(1)–50(4) and 52(1)–52(4) are adjacent to each other and the second series of pixels 52(1)–52(4) is offset from the first series of pixels 50(1)–50(4) by one-half the pixel pitch, although series of pixels 50(1)–50(4) and 52(1)–52(4) can have other configurations, the first and second series of pixels 50(1)–50(4) and 52(1)–52(4) could have other spacing arrangements, the different series of pixels 50(1)–50(4) and 52(1)–52(4) can be offset by other amounts, and each of the series of pixels 50(1)–50(4) and 52(1)–52(4) can have other numbers of pixels. Additionally, although two series of offset pixels 50(1)–50(4) and 52(1)–52(4) are shown, the CMOS imager 48 could have other configurations, such as a single series of pixels or three or more series of pixels. If multiple series of pixels are included, then the series of pixels will be offset by a reciprocal of the total number of series of pixels, e.g. if there are three series of pixels, then the pixels will be offset from each other by one-third, if there are four series of pixels, then the pixels will be offset from each other by one-fourth, etc., although other arrangements can be used, such as having the series of pixels offset by other amounts or having some of the series of pixels which are not offset. With the offset series of pixels 50(1)–50(4) and 52(1)–52(4), the output from the first series of pixels 50(1)–50(4) can be interleaved with the output from the second series of pixels 52(1)–52(4) in synchronism with the scanning motion. Interleaving the outputs, will increase the resolution of the system 40 over that of a system with a single series pixels, without adding to the overall length of the system or device and without significantly raising the cost.

The outputs of the CDS 64(1) and 64(2) are coupled to the output driver 66 which is coupled to the output bus 51 and the output of each amplifier is coupled to the input of one of the CDS 64(1) and 64(2). The sources and drains of FETs 68 and 74 are coupled to the input of amplifier 62(1) and the sources and drains of FETs 80 and 90 are coupled to the input of amplifier 62(2). In this particular embodiment, pixels 50(1) and 50(2) share the same sense node 100 which is coupled to one of the gates of FET 68, pixels 50(3) and 50(4) share the same sense node 102 which is coupled to one of the gates of FET 74, pixels 52(1) and 52(2) share the same sense node 104 which is coupled to one of the gates of FET 80, and pixels 52(3) and 52(4) share the same sense node 106 which is coupled to the gate of FET 90. The drain of a FET 70 is coupled to another gate of FET 68 and the source of the FET 70 is coupled to the pixel 50(1), the drain of a FET 72 is coupled to the same gate of FET 68 and the source of the FET 72 is coupled to the pixel 50(2), the drain of a FET 76 is coupled to another gate of FET 74 and the source of the FET 76 is coupled to the pixel 50(3), the drain of a FET 78 is coupled to the same gate of gate of FET 74 and the source of the FET 78 is coupled to the pixel 50(4), the drain of a FET 82 is coupled to another gate of FET 80 and the source of the FET 82 is coupled to the pixel 52(1), the drain of a FET 84 is coupled to the same gate of FET 80 and the source of the FET 84 is coupled to the pixel 52(2), the drain of a FET 86 is coupled to another gate of FET 90 and the source of the FET 86 is coupled to the pixel 52(3), and the drain of a FET 88 is coupled to the same gate of FET 86 and the source of the FET 88 is coupled to the pixel 50(4).

Address decoder 54(1) is coupled to the one gate of FET 68 and to the one gate of FET 74 and address decoder 54(2) is coupled to the one gate of FET 80 and to the one gate of FET 90. Address decoder 54(1) is also coupled to the gates of FETs 70, 72, 74, and 76 and address decoder 54(2) is also coupled to the gates of FETs 82, 84, 86, and 88. Address decoders 54(1) and 54(2) are also coupled together and to a clock 97 and a start pulse. A reset bias 56(1) is coupled to a source of a FET 92 and a source of a FET 94 and a reset bias 56(2) is coupled to a source of a FET 96 and a source of a FET 98. A drain of FET 92 is coupled to the source of FET 70 and to the source of FET 72, a drain of FET 94 is coupled to the source of FET 76 and to the source of FET 78, a drain of FET 96 is coupled to the source of FET 82 and to the source of FET 84, and a drain of FET 98 is coupled to the source of FET 86 and to the source of FET 88. A reset select 58(1) is coupled to a gate of FET 92 and a gate of FET 94 and a reset select 58(2) is coupled to a gate of FET 96 and a gate of FET 98. A photogate select 60(2) is coupled to pixels 50(1) and 50(3) and a photogate select 60(1) is coupled to pixels 50(2) and 50(4). A photogate select 60(3) is coupled to pixels 52(1) and 52(3) and a photogate select 60(4) is coupled to pixels 52(2) and 52(4).

Although the CMOS imager 48 which is disclosed above and also in U.S. Pat. No. 6,084,229 to Pace et al., which is herein incorporated by reference in its entirety, is utilized in this particular embodiment, other types of CMOS imagers can be used.

The image control processing system 47 is coupled to and controls the reset selects 58(1) and 58(2), address decoders 54(1) and 54(2), the photo gate selects 60(1) and 60(2), and the output driver 66 in the CMOS imaging system 46, although the image control processing system 47 could be coupled to other components. The image control processing system 47 includes a central processing unit (CPU) or processor or dedicated logic, a memory, and a transceiver system which are coupled together by a bus system or other link, respectively, although the image control processing system 47 may comprise other components and arrangements. The processor in the image control processing system 47 executes one or more programs of stored instructions for image processing, such as controlling the integration time of each series of pixel to insure a uniform integration period or to control the integration period for different series of pixels so that it is different for different colors, controlling binning of pixels between sets of series of pixels, such as rows or columns of pixels, and controlling when and which pixels in a series are skipped to increase resolution as well as other instructions, such as for video functions, printer motor driver controls, sheet feed controls, paper sorting controls, print head controls, a user interface, faxing and modem capabilities. Methods for controlling integration periods, binning of pixels and skipping pixels are also disclosed in U.S. Pat. No. 6,084,229 to Pace et al.

These programmed instructions either for the CPU or processor or dedicated logic are stored in the memory, although some or all of those programmed instructions could be stored and retrieved from one or more memories at other locations. A variety of different types of memory storage devices, such as a random access memory (RAM) either static or dynamic or a read only memory (ROM) in the system or a floppy disk, hard disk, CD ROM, or other computer readable medium which is read from and/or written to by a magnetic, optical, or other reading and/or writing system that is coupled to the processor, can be used for memory. The transceiver system is used to operatively couple and communicate between the image control processing system 47 and other systems, such as the CMOS imaging system 46. A variety of different types of computer interfaces could be used, such as infrared, USB, Blue Tooth, 811.XX, parallel port, 1394, Camera Link, DVI, or SMPTE 29X. In this particular embodiment, the image processing functions are in the image control processing system 47 which is on the same CMOS chip as the CMOS imaging system 46, although other arrangements could be used, such as having all of the functions for the image processing as well as other functions, such as for a desk top scanner or MFP, included in the CMOS imager 48 on the same chip or in separate components from the CMOS imaging system 46 on other chips which are then coupled together.

A power monitoring system 45 is coupled to the CMOS imaging system 46 and on the CMOS chip, although the power monitoring system 45 could be a component located on another chip and coupled to the chip with the CMOS imaging system 46. The power monitoring system 45 monitors the CMOS imaging system 46 to detect when the CMOS imaging system 46 is not in use, e.g. not capturing an image or transferring an image out, and then shutting down power consumption during non use periods to save power.

Figure 5:
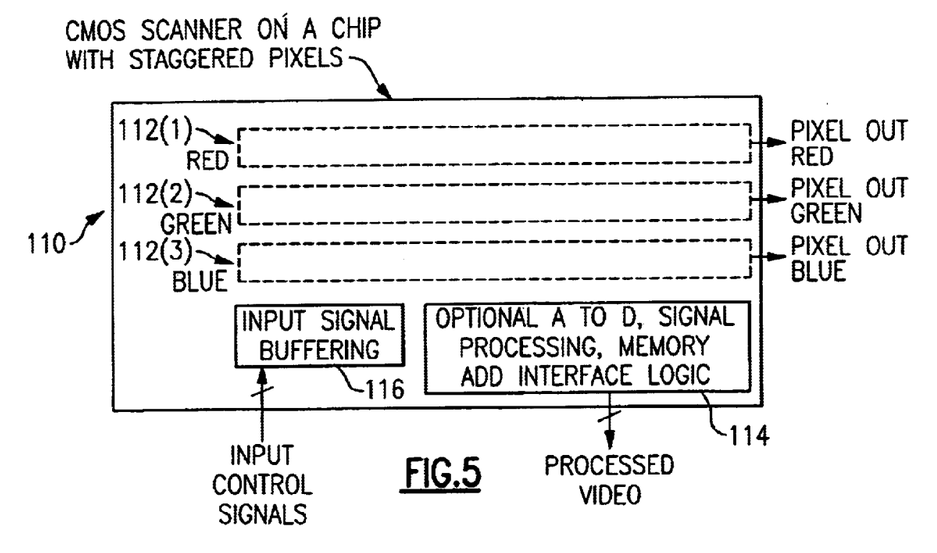
FIG. 5 is a block diagram of a CMOS imaging system in accordance with another embodiment of the present invention.
Figure 6:
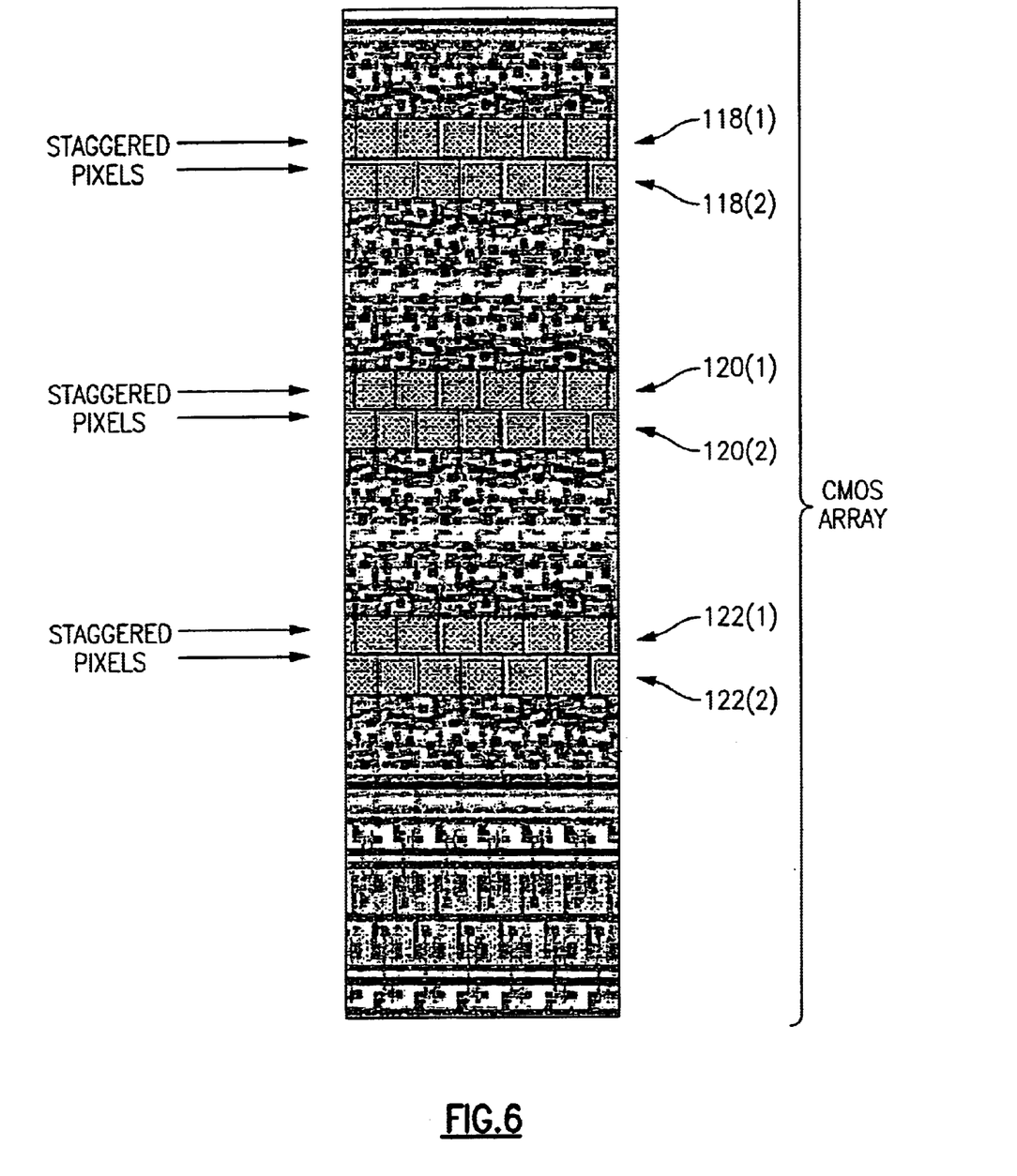
FIG. 6 is a diagram of three sets of offset series of pixels for the CMOS imagers shown in FIG. 5.

Referring to FIG. 5, a CMOS imaging system 110 for use in color scanning applications includes three CMOS imagers 112(1)–112(3) where each of the CMOS imagers 112(1)–112(3) represents a different color band, although other arrangements can be used, such as having other numbers of CMOS imagers and/or having the CMOS imagers represent the same color band or be monochrome. The CMOS imagers 112(1)–112(3) may also be used to capture the same color band or are monochrome. With multiple CMOS imagers 112(1)–112(3) other operations, such as binning of the signal from a pixel in one series in one of the CMOS imagers 112(1)–112(3) with the signal from a pixel in one series in another one of the CMOS imagers 112(1)–112(3), can be executed. Except as described herein, the structure and operation of CMOS imagers 112(1)–112(3) are the same as the CMOS imager 46 described with reference to FIG. 4 and thus will not be described again here. Each of the CMOS imagers 112(1)–112(3) has a set of series of pixels 118(1)–118(2), 120(1)–120(2), and 122(1)–122(2) as illustrated in FIG. 6.

In this particular embodiment, the color bands represented by the CMOS imagers 112(1)–112(3) are red, green and blue, although other color bands can be represented such as Cyan, Magenta and Yellow. A color filter is placed over each series of pixels 118(1)–118(2), 120(1)–120(2), and 122(1)–122(2) for the particular color band. In this particular embodiment, red, green, and blue color filters are used.

In this particular embodiment the image control processing system 114 is on the same chip as the CMOS imagers 112(1)–112(3), although the image control processing system 114 could be located in a separate component coupled to the CMOS imagers 112(1)–112(3) as shown in the embodiment in FIG. 3. The structure and operation of the image control processing system 114 is the same as the image control processing system 47 described with reference to FIGS. 3 and 4. The image control processing system 47 is used to control the operation of the CMOS imagers 112(1)–112(3) including functions in each CMOS imager 112(1)–112(3), such as controlling the integration time of each series of pixel to insure a uniform integration period or to control the integration period for different series of pixels so that it is different for different colors, controlling binning of pixels between sets of series of pixels, such as rows or columns of pixels, and controlling when and which pixels in a series are skipped to increase frame rate as well as other instructions, such as for video functions, printer motor driver controls, sheet feed controls, paper sorting controls, print head controls, a user interface, faxing and modem capabilities. Methods for controlling integration periods, binning of pixels and skipping pixels are disclosed in U.S. Pat. No. 6,084,229 Pace et al. CMOS imaging system 110 also includes an input buffer 116 which is coupled to CMOS imagers 112(1)–112(3) and is used to drive and control CMOS imagers 112(1)–112(3), including address decoders 54(1)–54(2), reset control 58(1)–58(2), CDS circuits 64(1)–64(2), photogate 60(1)–60(4), clock 97 and start 98, pixel select 66, a global reset of system 47, sense node resets 100, 102, 104, and 106, pixel skip or pixel binning and power down modes to eliminate power consumption when not in use.

The operation of the system 40 for capturing an image will now be described with reference to FIGS. 3 and 4. The lens system 44 focuses or directs a reduced image of the image 42 being scanned or otherwise captured onto at least a portion of the series of pixels 50(1)–50(4) and 52(1)–52(4) in the CMOS imager 48 in the CMOS imaging system 46, although other configurations of directing the image 42 could be used, such as directing an actual sized version or an enlarged version of the image on the CMOS imager 48. Additionally other devices, such as a mirror, can be used to direct the image on the CMOS imager 48.

When the image 42 is directed onto the series of pixels 50(1)–50(4) and 52(1)–52(4) which have photosensitive elements used to capture the image, the pixels 50(1)–50(4) and 52(1)–52(4) will begin to integrate the reduced image depending on the status of the photogate selects 60(1)–60(4) which are controlled by the image control processing system 47. The read out sequence of operation is to capture the image on the pixels 50(1)–50(4) and 52(1)–52(4), reset one or more of the sense nodes 100, 102, 104 and 106, by reset control 58(1)–(2), sensing the reset level for CDS and transferring one or more of the shared pixels onto each sense node by photogate control lines 60(1)–(4). In this particular embodiment, when one or more of the photogate selects 60(1)–60(2) are biased to one voltage level, such as zero volts by way of example only, then the rows of pixels can not integrate are reset and capture an image, such as an image of a document or other scanned object. When one or more of the photogate selects 60(1)–60(4) are biased to another voltage, such as 3.3 volts by way of example only, then the rows of pixels coupled to the photogate selects 60(1–60(4) at 3.3 can integrate and capture the image. Once the image is captured, then one to all of the photogate selects 60(1) –60(4) are biased back to the one voltage level, which in this example was zero volts. Operation of the photogate selects 60(1)–60(4) operate in conjunction with the sense nodes 100, 102, 104 and 106. Operation of the sense node 100 is in conjunction of the address decoders selection of FET 70 and 72 and reset of FET 92. What is illustrated in FIG. 4 are two pixels sharing the same sense node 100, for this example only. The number of pixels sharing the same sense node can vary from one to many. The more pixels sharing the same sense node, the more Photogate control 60(x) lines are needed which adds complexity to timing. This can be over come with intermediate storage between the pixels and the sense node, but again adds complexity to the pixel structure. One example of a pixel structure to accomplish this is shown in FIG. 7 and includes a photogate and a storage gate. Next the pixels with the captured signals from the document being scanned are transferred to the sense nodes for reading. A photogate control line 60(1)–60(4) and the associated sense nodes 100, 102, 104, and 106 determine which pixels 50(1)–50(4) and 52(1)–52(4) are selected for reading. For photogate control 60(2) the sense nodes are 100 and 102 and the pixels to be read are 50(1) and 50(3) respectively. All the pixel signals are transferred in parallel for each photogate control lines 60(1)–(4) and therefore the pixel select lines from address decoders 54(1) and 54(2) and associated with each photogate control 60(1)–60(4) must be turned on by the address decoder 54(1) or 54(2) at the same time. Therefore, photogate control 60(2), the sense nodes are 100 and 102, and the pixels to be read are 50(1) and 50(3) and the transfer FETs 70 and 76 must be selected by the address decoder 54(1) in parallel. The photogate control signal 60(2) is driven to zero to transfer charge on pixels 50(1) and 50(3) onto sense nodes 100 and 102. Then, the transfer FETs 70 and 76 are turned off by the address decoder 54(1) and photogate control 60(2) can then be rebiased to 3.3 Volts, for this example, and deplete the silicon under pixels 50(1) and 50(3) to begin integration for the next frame of integration. Now all of the pixels associated with photogate control 60(2) have the pixel information shuttered onto the sense nodes 100 and 102. Next, address decoders select which sense node 100 and 102 to read by selecting the control gate of FET 68 for output to the CDS circuit 64(1) by the operational amplifier 62(1) as described by U.S. Pat. No. 6,084,229 to Pace et al. and then the next pixel in sequence, if desired, is selected for reading by the address decoder 54(1) selecting the control gate of FET 74 and the sense node of 102 is read by operational amplifer 62(1) again.

This process is repeated again for pixels 50(2) and 50(4) being transferred on to sense nodes 100 and 102 after being reset by reset control 58(1), by the address decoder 54(1) selecting transfer FETs 72 and 78 and photogate control signal 60(1) then being driven to zero. The transfer control FETs 72 and 78 are turned off by the address decoder 54(1) to shutter the signal. The sense nodes 100 and 102 are selected for reading by the address decoder 54(1) by tuning on the control gate of FET 68 to output the pixel through operational amplifier 62(1) and CDS circuits 64(1) and the control gate of FET 68 is turned off again. The next pixel desired is selected for reading by the address decoder 54(1) turning on the control gate of FET 74 to output the pixel through operational amplifier 62(1) and CDS circuits 64(1) and the control gate of FET 74 is turned off again. Photogate control 60(1) is rebiased to 3.3 Volts to begin the next integration period as desired.

This process is repeated again for pixels 52(1) and 52(3) being transferred on to sense nodes, 104 and 106 after being reset by reset control 58(2), by the address decoder 54(2) selecting transfer FETs 82 and 86 and photogate control signal 60(3) then being driven to zero. The transfer control FETs 82 and 86 are turned off by the address decoder 54(2) to shutter the signal. The sense nodes are selected for reading by the address decoder 54(2) by turning on the control gate of FET 80 to output the pixel through operational amplifier 62(2) and CDS circuits 64(2) and the control gate of FET 80 is turned off again. The next pixel desired is selected for reading by the address decoder 54(2) turning on the control gate of FET 90 to output the pixel through operational amplifier 62(2) and CDS circuits 64(2) and the control gate of FET 90 is turned off again. Photogate control 60(3) is rebiased to 3.3 Volts to begin the next integration period as desired.

This process is repeated again for pixels 52(2) and 52(4) being transferred on to sense nodes, 104 and 106 after being reset by reset control 58(2), by the address decoder 54(2) selecting transfer FETs 84 and 88 and photogate control signal 60(4) then being driven to zero. The transfer control FETs 84 and 88 are turned off by the address decoder 54(2) to shutter the signal. The sense nodes are selected for reading by the address decoder 54(2) by turning on the control gate of FET 80 to output the pixel through operational amplifier 62(2) and CDS circuits 64(2) and the control gate of FET 80 is turned off again. The next pixel desired is selected for reading by the address decoder 54(2) turning on the control gate of FET 90 to output the pixel through operational amplifier 62(2) and CDS circuits 64(2) and the control gate of FET 90 is turned off again. Photogate control 60(4) is rebiased to 3.3 Volts to begin the next integration period as desired.

Normally photogate control signals of a series of pixels are all rebiased to 3.3 simultaneously to have a uniform integration time. The shared sense node 100, 102, 104, and 106 between pixels 50(1) and 50(2), 50(3) and 50(4), and 52(1) and 52(2), and 52(3) and 52(4), respectively, allow adjacent pixels 50(1) and 50(2), 50(3) and 50(4), and 52(1) and 52(2), and 52(3) and 52(4) in a series to be binned together by transferring both pixels of the shared sense node at the same time. This can be accomplished by this example when the address decoder 54(1) selects transfer FETs 70 and 72 at the same time and photogate control 60(1) and 60(2) are operated simultaneously as well. All pixels 50(1)–50(4) connected to photogate control signals 60(1) and 60(2) will be transferred at the same time and all transfer gates will need to be selected at the same time. Otherwise the sense node reset, transfer and reading are the same as previously described. One or more pixels 50(1)–50(4) and 52(1)–52(4) can be skipped as desired by the address decoders or shift registers 54(1) and 54(2); while, maintaining the maximum read out speed for higher frame rate. Also, by utilizing the hi amplifier configuration of U.S. Pat. No. 6,084,229 Pace et al., the address decoders 54(1) and 54(2) can select multiple sense nodes 100, 102, 104, and 106 of a series of pixels 50(1)–50(4) and 52(1)–52(4), by way of this example, at the same time for the darkest signal on the selected sense nodes, is the signal that will dominate the output of operational amplifier 62(1). The darkest signal is the signal with the highest signal level for a selected sense node and is the sense node that will be saturated to complete the operational amplifier of U.S. Pat. No. 6,084,229 to Pace et al. for the NFETs shown of FIG. 4. This method of selecting the darkest pixel when multiple sense nodes are selected is called "auto black binning". The whitest pixel can be selected in the same manner if sense FETs 68, 74, 80 and 90 are PFETs instead of NFETs as shown in FIG. 4 and in this case called "auto white binning". In scanning applications where the paper is often white and the text being imaged is black. The order in which the pixels 50(1)–50(4) and 52(1) –52(4) are read can occur in a predetermined sequence from a shift register or random address decoder 54(1) and 54(2) and how many series of pixels is multiplexed or interleaved by the pixel select and output driver 66. Extra control lines may be required to change to pixel order and this implementation is obvious to those of ordinary skill in the art and thus is not shown here. Although, the shuttering operation is complete when binning all pixels 50(1) and 50(2), 50(3) and 50(4), 52(1) and 52(2), 52(3) and 52(4) within a sense node 100, 102, 104, and 106, a potential problem arises when reading out pixels that share a sense node separately. The problem is when the pixels of the shared sense node have a delay between photogate control signals, transferring charge at different time, causes pixels of the same series to have slightly different integration times. A solution to this problem is to have a storage site per pixel as illustrated in FIG. 7.

The signals from the output of amplifiers 62(1) and 62(2) are supplied to CDS 64(1) and 64(2) and the outputs of the CDS 64(1) and 64(2) are coupled to the output driver 66 which outputs the signals to an output bus 51 in this example. Accordingly, with the present invention signals from the pixels 50(1)–50(4) and 52(1)–52(4) in the CMOS imager 48 in the CMOS imaging system 46 independently selected and coupled to the output 51 in any order desired. For example, the signals from the pixels 50(1)–50(4) and 52(1)–52(4) can be interleaved to increase resolution without substantially increasing the length or size of the imaging system 46 or if some of the signals on the pixels 50(1)–50(4) and 52(1)–52(4) are selected and others are skipped, the frame rate can be increase, but at a lower resolution for the resulting image.

The operation of the system 40 for capturing an image with the CMOS imaging system 110 with CMOS imagers 112(1)–112(3) replacing the CMOS imaging system 46 will now be described with reference to FIGS. 3, 5, and 6. The operation of each of the CMOS imagers 112(1)–112(3) in FIG. 5 is the same as the CMOS imager 48 in FIG. 4 except as described herein. With this system, the lens 44 focuses or directs a reduced image of the image being scanned or otherwise captured onto the series of pixels 118(1)–118(2), 120(1)–120(2), and 122(1)–122(2) on the CMOS imagers 112(1)–112(3) in the CMOS imaging system 110, although again other configurations for directing the image could be used, such as directing an actual sized version or an enlarged version of the image on the CMOS imagers 112(1)–112(3). Additionally other devices, such as a mirror, can be used to direct the image on the CMOS imagers 112(1)–112(3).

In this particular embodiment, a different filter is over each of the sets of series of pixels 118(1)–118(2), 120(1) –120(2), and 122(1)–122(2) in the CMOS imagers 112(1) –112(3) and the filters filter out red for series of pixels 118(1)–118(2) in CMOS imager 112(1), green for series of pixels 120(1)–120(2) for CMOS imager 112(2), and blue for series of pixels 122(1)–122(2) for CMOS imager 112(3), although the CMOS imagers 112(1)–112(3) could each be filtered to capture other information or could be monochrome. The process for capturing and processing the signals from each of the series of pixels 118(1)–118(2), 120 (1)–120(2), and 122(1)–122(2) in CMOS imagers 112(1) –112(3) is the same as described above for the series of pixels 50(1)–50(4) and 52(1)–52(2) in CMOS imager 48 in FIG. 4.

With the CMOS imaging system 110 with the three CMOS imagers 112(1)–112(3), the integration time of each series of pixels 118(1)–118(2), 120(1)–120(2), and 122(1) –122(2) in each of the CMOS imagers 112(1)–112(3) for the different color bands can be independently controlled. With independent control of integration time for each of the CMOS imagers 112(1)–112(3), each of the CMOS imagers 112(1)–112(3) can receive a different amount of light for the corresponding color band from the light source. If each color is allowed to integrate for a slightly different amount of time, then the color balance can be achieved during the integration period, rather than through post processing by an image processor. This simplifies the scanning or imaging operation and improves the signal-to-noise balance of the three color channels. Optionally, a black reference series of pixels or a few black reference pixels are added to each series of pixels 118(1)–118(2), 120(1)–120(2), and 122(1)–122(2) in the CMOS imagers 112(1)–112(3). Another option is to add a monochrome series of pixels to the CMOS imagers 112(1) –112(3) as a reference to assist with line art and text only scanning applications.

With the CMOS imaging system 110 with the three CMOS imagers 112(1)–112(3), other methods may also be carried out. For example, signals from pixels from different CMOS imagers 112(1)–112(3) may be binned to combine the signals together before being output. Binning provides a lower resolution at higher frame rate. Binning is often defined as summation of adjacent signals or data from pixels and is accomplished by transferring more than one signal from pixels on to the same node, such as an output bus 51.

Alternate pixel structure to pixels in series 50(1)–50(4) and 52(1)–52(4) are illustrated in FIG. 7. All other circuit aspects of FIG. 4 remain the same for this example. All timing remains as previously described with the following exceptions. Photogate control for a series of pixels 60(1)–(4) as shown in FIG. 4 remains the same and the connection from one of these photogate controls 60(1)–60(4) is shown as an input to a FET 138 for the storage gate. Prior to transferring the photon generated charge to sense nodes 100, 102, 104 and 106, in this example there are two extra timing steps that must occur first and two extra FETs 136 and 138 have been added to insure uniform integration of all pixels in series. After pixels 50(1)–50(4) and 52(1)–52(4), such as the pixel adjacent FET 134 which represents one of the pixels 50(1)–50(4) and 52(1)–52(4), have integrated signal for the desired period, all pixels 50(1)–50(4) and 52(1)–52 (4) have the photon generated charge transferred through TX1 by selecting a gate of FET 136 and biasing a storage gate under FET 138 to 3.3 Volts, for this example, and turning off the photogate 134 by biasing the photogate 134 to zero volts and turning off TX1. Now the storage gate under FET 138 takes the place of one of the photogate controls 60(1)–(4) and the timing is the same as previously described. The pixel integration can resume immediately by rebiasing photogate 134 to 3.3 Volts by this example. FIG. 7 allows for uniform integration of all pixels and complete control of pixel binning, skipping and allowing "auto black binning" or "auto white binning" in any sequence desired.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Accordingly, the invention is limited only by the following claims and equivalents thereto.

What is claimed is:

1. A system for scanning an image, the system comprising:
  a CMOS imaging system including at least one CMOS imager having two series of pixels adjacent one another and wherein one of the series of pixels is offset from the other of the series of pixels;
  an image focusing device for directing the image onto at least a portion of said series of pixels; and
  an image control system coupled to the CMOS imaging system,
  wherein the image control system includes means for controlling integration and readout of the pixels respectively within said series of pixels;
  wherein a plurality of groups of the pixels within each said series of pixels share a common sense node of a plurality of sense nodes, and each said pixel includes a respective charge storage site, so as to permit the pixels at the same sense node to have different integration times.

2. The system as set forth in claim 1 wherein said image control system comprises shutter controller means for controlling integration times of the pixels for the respective pixels in at least one of said series of pixels.

3. The system as set forth in claim 2 wherein said image control system comprises resolution adjustment means for selectively skipping read out of one or more of the pixels in at least one of said series of pixels so as to permit reduction of resolution and increase of frame rate.

4. The system as set forth in claim 2 wherein said at least one CMOS imager includes three pairs of series of pixels, and respective color filters for said pair of series of pixels to capture different respective bands of color.

5. The system as set forth in claim 4 wherein said image system comprises a binning system that combines respective pixel signals from each of said pairs of series of pixels.

6. The system as set forth in claim 5 wherein said image control processing system includes means controlling integration times of the respective series of pixels to achieve color balance.

7. The system as set forth in claim 1 wherein said image control processing system includes means controlling integration times of the respective pixels within each said series of pixel.

8. The system as set forth in claim 4 wherein said image control processing system further comprises shutter controller means for each said pair of series of pixels, with each said shutter controller means with each of the shutter controller means controlling integration times for all the pixels of the respective pair of series of pixels.

9. The system as set forth in claim 1 wherein said image control processing system includes auto black binning means for selecting a darkest pixel among a group of pixels within a series of pixels.

10. The system as set forth in claim 1 wherein said image control processing system includes auto white binning means far selecting a whitest pixel among a group of pixels within said series of pixels.

* * * * *

UNITED STATES PATENT AND TRADEMARK OFFICE
CERTIFICATE OF CORRECTION

PATENT NO. : 6,911,639 B2
DATED : June 28, 2005
INVENTOR(S) : Christian Boemler et al.

It is certified that error appears in the above-identified patent and that said Letters Patent is hereby corrected as shown below:

Column 8,
Line 8, "tuning" should read -- turning --.

Column 12,
Line 37, "far" should read -- for --.

Signed and Sealed this

Thirtieth Day of August, 2005

JON W. DUDAS
*Director of the United States Patent and Trademark Office*